United States Patent
Takeda et al.

(10) Patent No.: US 7,202,515 B2
(45) Date of Patent: Apr. 10, 2007

(54) HETEROJUNCTION BIPOLAR TRANSISTOR AND MANUFACTURING METHOD THEREOF

(75) Inventors: Hidenori Takeda, Nara (JP); Toshiharu Tambo, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/213,870

(22) Filed: Aug. 30, 2005

(65) Prior Publication Data
US 2006/0046411 A1    Mar. 2, 2006

(30) Foreign Application Priority Data
Sep. 1, 2004   (JP) .............................. 2004-253816

(51) Int. Cl.
*H01L 31/072*    (2006.01)
(52) U.S. Cl. ............... 257/197; 257/587; 257/E21.371; 438/235; 438/E21.387

(58) Field of Classification Search ................ 257/197, 257/198, 592; 438/345, 706
See application file for complete search history.

(56) References Cited

U.S. PATENT DOCUMENTS 6,683,332 B2 * 1/2004 Shinozaki et al. ........... 257/186
6,803,248 B2 * 10/2004 Sadaka et al. ................ 438/47
2005/0035370 A1 * 2/2005 Chen .......................... 257/198

FOREIGN PATENT DOCUMENTS

JP          5-109756 A      4/1993
JP          11-186278 A     7/1999

* cited by examiner

*Primary Examiner*—Quoc Hoang
(74) *Attorney, Agent, or Firm*—McDermott Will & Emery LLP

(57) ABSTRACT

In the method for manufacturing a heterojunction bipolar transistor, a collector contact layer, a collector layer, a base layer, a base protection layer, an emitter layer, an emitter contact layer, and a WSi layer are sequentially formed on a substrate. A resist pattern is then formed on the WSi layer, and the WSi layer is patterned by using the resist pattern as a mask. Thereafter, the emitter contact layer and the emitter layer are sequentially removed by ICP (Inductively Coupled Plasma) dry etching by using the resist pattern as a mask.

3 Claims, 4 Drawing Sheets

HETEROJUNCTION BIPOLAR TRANSISTOR AND MANUFACTURING METHOD THEREOF

BACKGROUND OF THE INVENTION

The present invention generally relates to a heterojunction bipolar transistor (HBT) and a manufacturing method thereof. More particularly, the present invention relates to a self-aligned heterojunction bipolar transistor and a manufacturing method thereof.

Shrinking of transistor dimensions is required for reduced parasitic resistance and reduced parasitic capacitance in heterojunction bipolar transistors (HBTS) and for higher operation speed, higher integration, and lower power consumption. Self-aligned HBTs are advantageous for shrinking of transistor dimensions, and a method for forming an undercut region in a semiconductor layer that forms an emitter has been actively used among the manufacturing processes of self-aligned HBTs. In this manufacturing process, an emitter electrode is formed on a semiconductor layer that forms an emitter, and then, side etching is conducted to the semiconductor layer to form an undercut region that is recessed with respect to the emitter electrode. Thereafter, a metal film for forming an electrode is formed by vapor deposition. The emitter electrode and the base electrode are simultaneously and separately formed from this metal film. In this method, the distance between the emitter region having a mesa structure of fine dimensions and the base electrode can be reduced as much as possible, whereby parasitic base resistance can be reduced significantly.

The most convenient method for conducting side etching to a semiconductor layer that forms an emitter is to conduct selective wet etching by using an emitter electrode as a mask. When wet etching is conducted to a GaAs- or InP-based compound semiconductor, the compound semiconductor commonly has a trapezoidal shape or an inverted-trapezoidal shape (a trapezoid whose upper base is longer than the lower base) depending on its crystal orientation. This shape influences the limit of shrinking of transistor dimensions in view of the contact area between the emitter layer and the layers formed on and under the emitter layer. In order to realize a fine self-aligned InP/InGaAs HBT having an InGaAs base layer, Japanese Laid-Open Patent Publication No. 11-186278 (Japanese Patent No. 3,350,426) discloses an optimal material and optimal heat treatment conditions for a T-shaped stacked emitter electrode in an emitter mesa cross-sectional structure.

The conventional method for manufacturing a self-aligned HBT will be described with reference to FIGS. 4A to 4C. FIGS. 4A to 4C are cross-sectional views illustrating a conventional manufacturing process of a self-aligned HBT.

In the conventional manufacturing method, a collector contact layer 114, a collector layer 115, a base layer 116, an emitter layer 117, and an emitter contact layer 118 are sequentially formed on an InP substrate 113 in this order in the step of FIG. 4A. A WSi layer 119 is then deposited on the entire surface of the emitter contact layer 118 by a sputtering method. A Ti/Pt electrode layer 120 is then formed on the WSi layer 119 by a lift-off method.

In the step of FIG. 4B, by using the Ti/Pt electrode layer 120 as a mask, the exposed part of the WSi layer 119 is selectively removed by an RIE (Reactive Ion Etching) method using sulfur hexafluoride ($SF_6$). Side etching is then conducted to the part of the WSi layer 119 which is covered by the Ti/Pt electrode layer 120. A T-shaped stacked emitter electrode 121 is thus formed from the Ti/Pt electrode 120 and the WSi layer 119 that has a smaller area than that of the Ti/Pt electrode 120.

Thereafter, the following three-step etching is conducted by using the T-shaped stacked emitter electrode 121 as a mask: first, the emitter contact layer 118 is anisotropically etched in the depth direction (the direction perpendicular to the substrate surface) by an ECR-RIE (Electron Cyclotron Resonance-Reactive Ion Etching) method by using a chlorine-argon ($Cl_2$—Ar) mixed gas diluted with an inert gas. Thereafter, side etching is conducted to the emitter contact layer 118 by using a selective wet etchant that is formed from citric acid, hydrogen peroxide solution, and water. As a result, an undercut portion 125 that is recessed with respect to the T-shaped stacked emitter electrode 121 is formed in the emitter contact layer 118. Finally, by using a wet etchant that is formed from hydrochloric acid and phosphoric acid, the InP emitter layer 117 is selectively etched so that the region of the InP emitter layer 117 which is not covered by the emitter contact layer 118 is removed. As a result, the InGaAs base layer 116 is exposed.

In the step of FIG. 4C, a metal layer 122 for forming a base electrode is formed on the top surface of the T-shaped stacked emitter electrode 121 and on the top surface of the InGaAs base layer 116 by electron beam evaporation. The metal layer 122 is a Pt/Ti/Pt/Au layer. In this way, a semiconductor device having a self-aligned emitter/base mesa structure can be manufactured.

As described above, in the conventional manufacturing method, anisotropic dry etching and wet etching are sequentially conducted as etching for forming the undercut portion 125 in the emitter layer in order to improve dimensional control and to prevent emitter-base short-circuiting. However, this wet etching shapes the emitter contact layer 118 into a trapezoidal shape, thereby limiting shrinking of dimensions.

SUMMARY OF THE INVENTION

It is an object of the present invention to provide a self-aligned HBT that enables further shrinking of dimensions and a manufacturing method thereof.

According to a first aspect of the invention, a method for manufacturing a heterojunction bipolar transistor includes the steps of: (a) sequentially forming a collector layer, a base layer, a base protection layer, an emitter layer, an emitter contact layer, and a first metal film on a substrate; (b) after the step (a), forming a first resist on a part of the first metal film; (c) after the step (b), patterning the first metal film by using the first resist as a mask; (d) after the step (c), conducting dry etching at a higher selectivity of the emitter layer over the emitter contact layer until the base protection layer is exposed by using the first resist layer as a mask, in order to make a width of the emitter layer narrower than that of the emitter contact layer; (e) after the step (d), removing the first resist to expose the first metal film; and (f) after the step (e), depositing a second metal film after forming a second resist that exposes the first metal film and the exposed part of the base protection layer, and removing the second resist and a part of the second metal film which is located on the second resist.

In the method of the first aspect, the dry etching of the step (d) may be conducted by using a gas containing chlorine.

In the method of the first aspect, the dry etching of the step (d) may be conducted by using a gas containing silicon tetrachloride.

The method of the first aspect may further include the step of (g) between the steps (c) and (d), removing at least a part of the emitter contact layer by dry etching by using the first resist as a mask. Since the emitter contact layer is removed in advance in the step (g), the emitter contact layer will not remain after dry etching is conducted at a higher selectivity of the emitter layer over the emitter contact layer in the step (d).

In the method of the first aspect, the dry etching of the step (g) may be conducted by using a gas containing argon and chlorine. When the emitter contact layer contains In, the use of a gas containing argon and chlorine improves selectivity of the layer containing In.

According to a second aspect of the invention, a heterojunction bipolar transistor includes: a collector region layer; a base layer formed on the collector region layer; a base protection layer formed on the base layer; a base electrode formed on a part of the base protection layer; an emitter layer formed on another part of the base protection layer and forming a heterojunction with the base layer; an emitter contact layer formed on the emitter layer; and an emitter electrode formed above the emitter contact layer. A side surface of the emitter layer is shaped by dry etching and is substantially perpendicular to a top surface of the emitter layer. A width of the emitter layer is narrower than that of the emitter contact layer.

In the heterojunction bipolar transistor of the second aspect, the emitter layer may contain Ga and As, and the base protection layer may contain In.

In the heterojunction bipolar transistor of the second aspect, the base protection layer may be formed from InGaP.

In the heterojunction bipolar transistor of the second aspect, the emitter contact layer may contain In.

In the heterojunction bipolar transistor of the second aspect, the emitter contact layer may be formed from InGaAs.

DETAILED DESCRIPTION OF THE INVENTION

Hereinafter, an embodiment of the invention will be described in detail with reference to FIGS. 1A to 1C and FIGS. 2A to 2C. FIGS. 1A to 1C and FIGS. 2A to 2C are cross-sectional views illustrating a manufacturing process of a semiconductor device according to an embodiment of the invention.

Figure 1A:
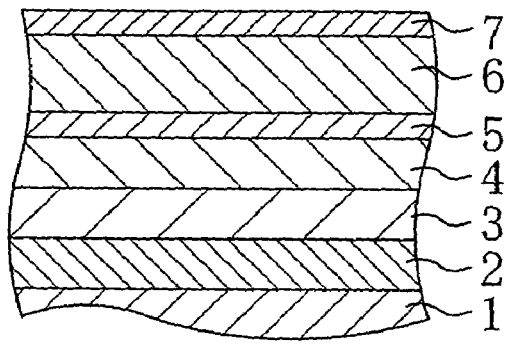
FIGS. 1A, 1B, and 1C are cross-sectional views illustrating a manufacturing process of a semiconductor device according to an embodiment of the invention.

In the manufacturing process of the invention, an $n^+$-type GaAs collector contact layer 2, an $n^+$-type GaAs collector layer 3, a $p^+$-type GaAs base layer 4, an $n^+$-type InGaP base protection layer 5, an $n^+$-type GaAs emitter layer 6, and an $n^+$-type InGaAs emitter contact layer 7 are sequentially epitaxially grown on a GaAs substrate 1 in this order in the step of FIG. 1A.

Figure 1B:
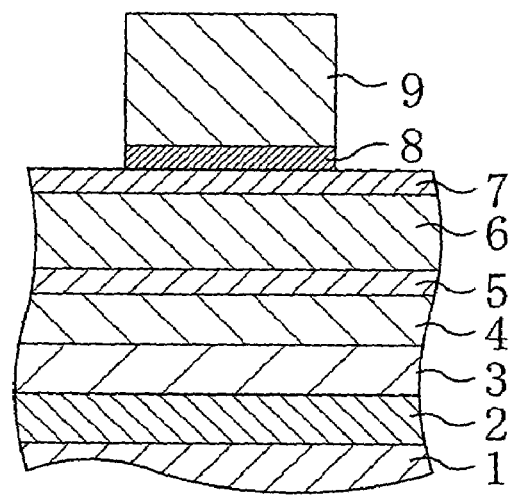

In the step of FIG. 1B, a WSi layer 8 of 100 nm thick is then deposited on the entire surface of the $n^+$-type InGaAs emitter contact layer 7 by a sputtering method. A resist pattern 9 is then formed on the WSi layer 8. By using the resist pattern 9 as a mask, the WSi layer 8 is selectively etched by ICP (Inductively Coupled Plasma) dry etching using $CF_4/SF_6$ gas.

Figure 1C:
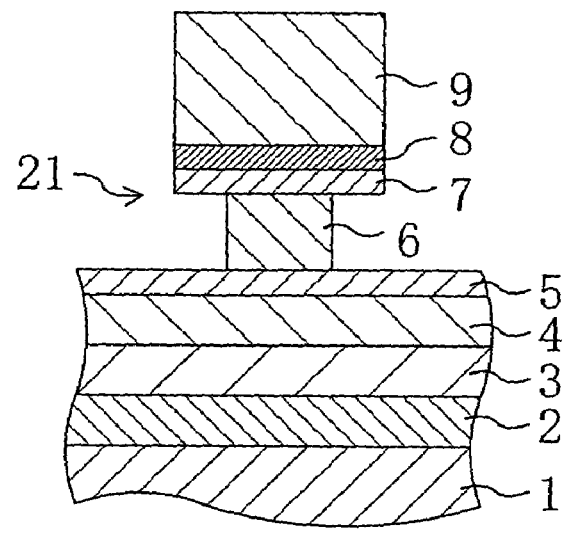

In the step of FIG. 1C, the $n^+$-type InGaAs emitter contact layer 7 and the $n^+$-type GaAs emitter layer 6 are then sequentially removed by ICP dry etching.

The $n^+$-type InGaAs emitter contact layer 7 is etched under the following conditions: chlorine gas flow rate: 10 sccm (ml/min); Ar gas flow rate: 40 sccm; pressure: 0.7 Pa; applied power to the ICP coil: 150 W; substrate bias power: 100 W; and coolant temperature of the substrate stage: 60° C. Heat exchange is accelerated by accumulating He between the GaAs substrate 1 and the stage. InGaAs is etched at about 60 nm/min under the above conditions. Under the above conditions, InGaAs and GaAs are anisotropically etched to the dimensions approximately corresponding to those of the resist pattern 9. Moreover, GaAs is etched at about 130 nm/min under the above conditions. In order to prevent excessive removal of GaAs, it is desirable to detect an etching end point by spectrometry or the like so that InGaAs can be completely removed and that overetching can be reduced as much as possible.

The $n^+$-type GaAs emitter layer 6 is etched under the following conditions: chlorine gas flow rate: 100 sccm; pressure: 2 Pa; applied power to the ICP coil: 200 W; substrate bias power: 35 W; and coolant temperature of the substrate stage: 60° C. Heat exchange is accelerated by accumulating He between the GaAs substrate 1 and the stage. Under the above conditions, GaAs is etched at about 340 mm/min whereas InGaAs and InGaP are etched at 10 mm/min or less. Therefore, selectivity of GaAs over InGaAs and InGaP is sufficiently ensured. Under the above conditions, the $n^+$-type GaAs emitter layer 6 having 300 nm thickness is etched for 69 seconds that correspond to about 30% overetching. As a result, an undercut 21 (about 0.5 μm on each side) is formed in the emitter layer 6, as shown in FIG. 1C.

In the above description, $Cl_2/Ar$ gas was used for etching of the emitter contact layer 7, and $Cl_2$ gas was used for etching of the emitter layer 6. Since In is less reactive with chlorine than Ga and As are, it is desirable to add a gas that accelerates sputtering etching such as Ar for etching of an In-containing layer. For etching of GaAs, however, it is desirable not to add Ar gas when selectivity of GaAs over an In-containing film is required.

Figure 2A:
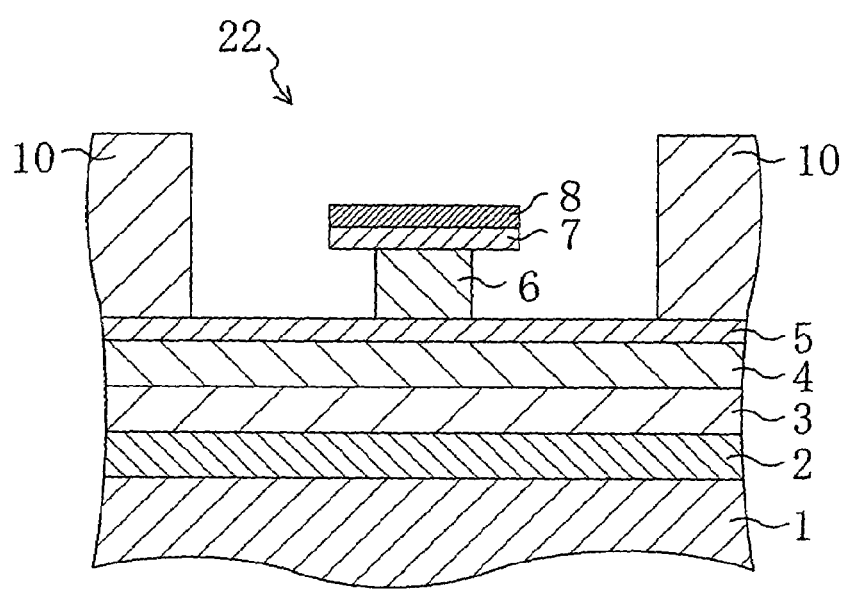
FIGS. 2A, 2B, and 2C are cross-sectional views illustrating a manufacturing process of a semiconductor device according to an embodiment of the invention.
Figure 2B:
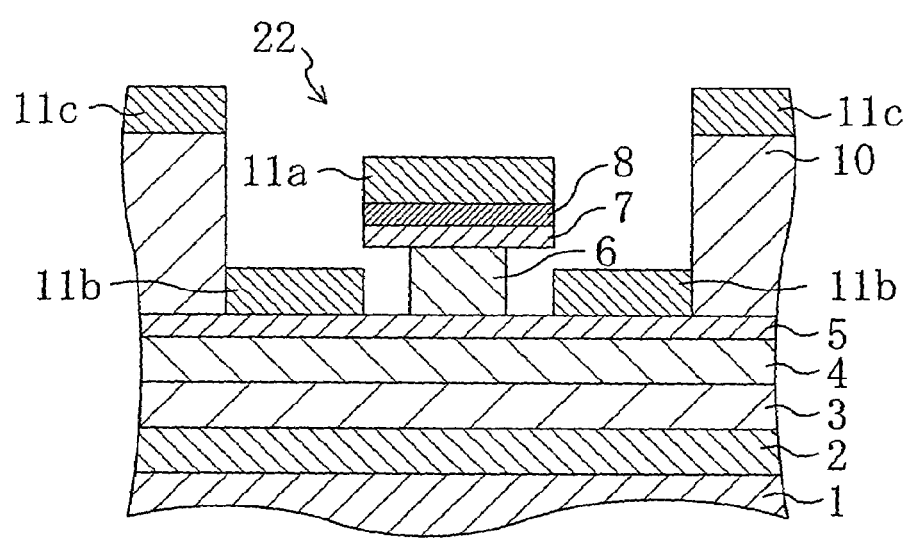
Figure 2C:
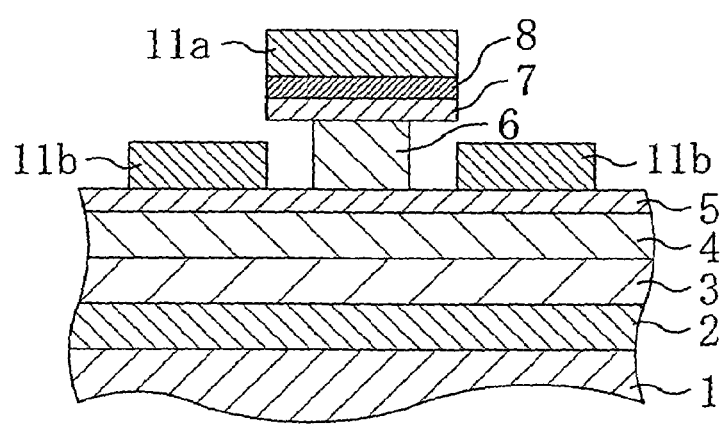

In the step of FIG. 2A, the resist pattern 9 is removed with an organic solvent, and a resist pattern 10 is formed. The resist pattern 10 has an opening 22 in a region where an emitter electrode and a base electrode are to be formed. In other words, the resist pattern 10 has an opening 22 in the region of the WSi layer 8 and the region on both sides of the WSi layer 8. Thereafter, in the step of FIG. 2B, Pt, Ti, Pt, and Au are sequentially formed on the wafer substrate in this order as a metal layer 11 by a vapor deposition method. As a result, metal layers 11a, 11b, and 11c are formed on the WSi layer 8 and the base protection layer 5 in the opening 22 and on the resist pattern 10, respectively. Note that the metal layer 11a serves as an emitter electrode, and the metal layer 11b serves as a base electrode. Thereafter, the resist pattern 10 is removed in the step of FIG. 2C. A self-aligned HBT structure is thus obtained.

Thereafter, Pt of the metal layer 11b (the base electrode) is thermally diffused into the base protection layer 5 in order to electrically connect the metal layer 11b to the base layer 4.

Figure 3:
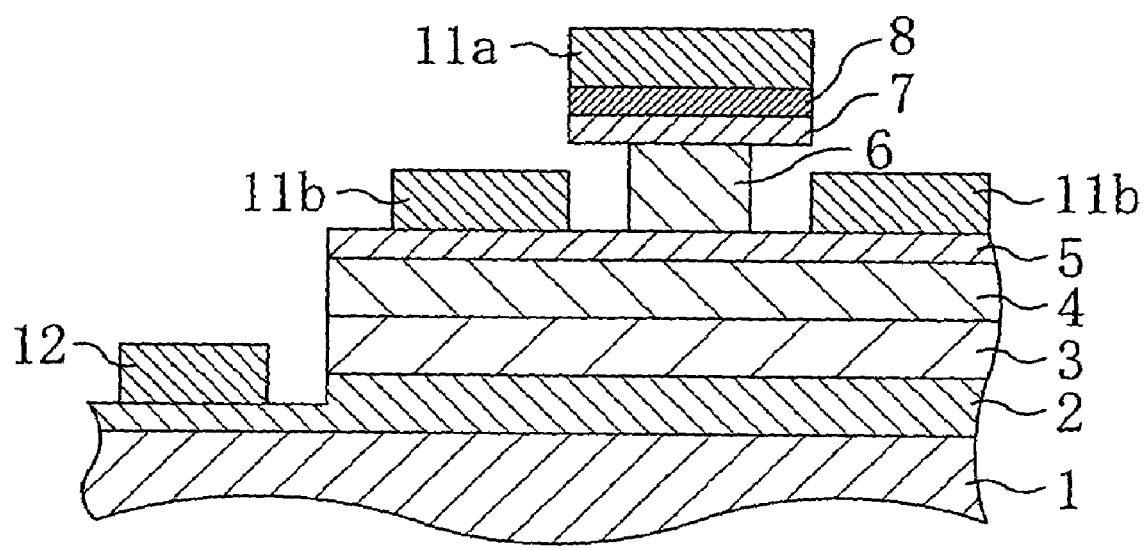
FIG. 3 is a cross-sectional view showing the structure of a semiconductor device according to an embodiment of the invention.
Figure 4A:
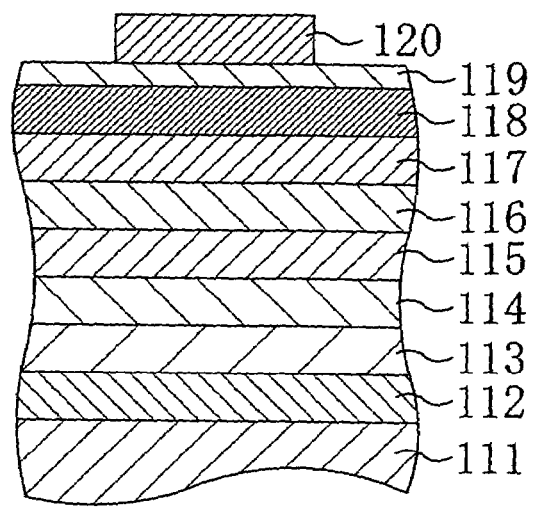
FIGS. 4A, 4B, and 4C are cross-sectional views illustrating a conventional manufacturing process of a self-aligned HBT.
Figure 4B:
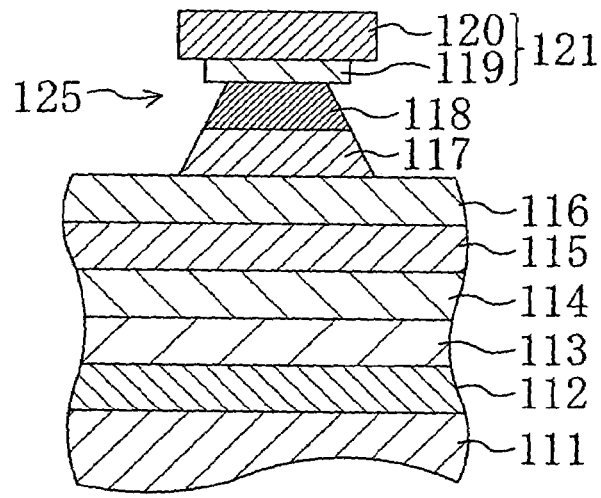
Figure 4C:
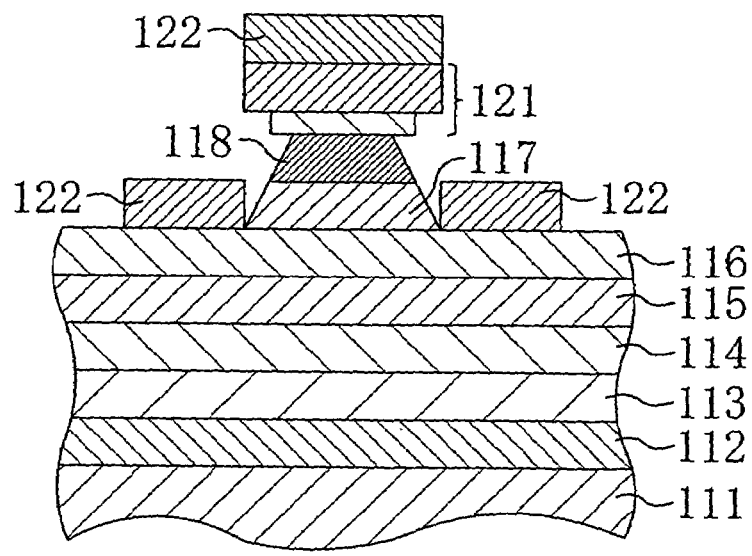

The base protection layer 5, the base layer 4, and the collector layer 3 are then partially removed by etching so that a part of the collector contact layer 2 is exposed. Thereafter, a collector electrode 12 is formed on the exposed part of the collector contact layer 2 by a vapor deposition/lift-off method. The transistor of FIG. 3 is thus obtained. FIG. 3 is a cross-sectional view of the structure of a semiconductor device according to an embodiment of the invention.

In this embodiment, the emitter electrode and the base electrode are formed simultaneously. However, the emitter, base, and collector electrodes can be formed simultaneously by changing the order of the steps. More specifically, after the undercut 21 is formed in the step of FIG. 1C, the base protection layer 5, the base layer 4, and the collector layer 3 are partially removed by etching so that a part of the collector contact layer 2 is exposed. Thereafter, a resist (not shown) is formed on the wafer substrate so that the WSi layer 8, the region on both sides of the WSi layer 8, and the exposed part of the collector contact layer 2 are exposed. A metal film (not shown) is then formed on the wafer substrate. In this way, the emitter, base, and collector electrodes can be formed simultaneously.

In this embodiment, the resist pattern 9 is 2 μm long in the emitter length direction, and the emitter length is about 1 μm. A finer structure can be formed by changing the length of the resist pattern 9 and the etching conditions for the emitter layer 6.

For example, the etching conditions for the emitter layer 6 can be changed by the following methods: a first method is to reduce etching time. When about 15% overetching is conducted, the amount of undercut is reduced to about 0.4 μm. A second method is to reduce the coolant temperature of the substrate stage. As the coolant temperature is reduced, a reaction product is more likely to adhere to the sidewall, whereby the amount of undercut is reduced. When the coolant temperature is reduced to 20° C., the amount of undercut is reduced to about 0.3 μm. A third method is to add a gas that increases a reaction product of a low vapor pressure. For example, when a mixed gas of chlorine (flow rate: 10 sccm) and silicon tetrachloride (flow rate: 50 sccm) is used as etching gas instead of chlorine gas, the amount of undercut is reduced to about 0.2 μm. Other methods for reducing the amount of undercut are to increase the bias power in order to increase anisotropy, and the like.

As has been described above, according to the present invention, dry etching is conducted in the step of FIG. 1C. Therefore, removed grains are less likely to re-adhere to the emitter layer 6 as compared to the wet etching in the conventional example. Accordingly, the sidewall of the emitter layer 6 can be made closer to perpendicular to the substrate surface regardless of crystal orientation. In this way, shrinking of dimensions of the heterojunction bipolar transistors (HBTs) can be achieved without causing short-circuiting of the emitter layer 6 and the base layer 4. Therefore, the parasitic resistance and parasitic capacitance of the HBTs are reduced, whereby higher operation speed, higher integration, and lower power consumption can be achieved.

What is claimed is:

1. A hetero junction bipolar transistor, comprising:
   a collector region layer;
   a base layer formed on the collector region layer;
   a base protection layer formed on the base layer and containing In;
   a base electrode formed on a part of the base protection layer;
   an emitter layer formed on another part of the base protection layer and forming a heterojunction with the base layer and containing Ga and As;
   an emitter contact layer formed on the emitter layer and containing In; and
   an emitter electrode formed above the emitter contact layer and including a WSi layer and other metal layers, wherein
   a side surface of the emitter layer is shaped by dry etching and is substantially perpendicular to a top surface of the emitter layer, and a width of the emitter layer is narrower than that of the emitter contact layer.

2. The hetero junction bipolar transistor according to claim 1, wherein the base protection layer is formed from InGaP.

3. The heterojunction bipolar transistor according to claim 1, wherein the emitter contact layer is formed from InGaAs.

* * * * *